United States Patent [19]

Flowers

[11] Patent Number: 4,521,441
[45] Date of Patent: Jun. 4, 1985

[54] PLASMA ENHANCED DIFFUSION PROCESS

[75] Inventor: Dervin L. Flowers, Scottsdale, Ariz.

[73] Assignee: Motorola, Inc., Schaumburg, Ill.

[21] Appl. No.: 562,679

[22] Filed: Dec. 19, 1983

[51] Int. Cl.³ ............................................. B05D 3/06
[52] U.S. Cl. ...................................... 427/38; 427/85;
    427/259; 427/377; 427/379; 427/419.2;
    427/419.7
[58] Field of Search .................. 427/38, 272, 85, 282,
    427/343, 259, 376.1, 379, 380, 377, 404, 419.3,
    419.2, 419.7

[56] References Cited

U.S. PATENT DOCUMENTS

| | | | |
|---|---|---|---|
| 3,718,502 | 2/1973 | Gibbons | 427/38 |
| 3,765,940 | 10/1973 | Hentzschel | 427/85 |
| 4,243,427 | 1/1981 | DiBugnara | 427/85 |
| 4,382,099 | 5/1983 | Legge et al. | 427/85 |
| 4,411,734 | 10/1983 | Maa | 427/85 |

FOREIGN PATENT DOCUMENTS

| | | | |
|---|---|---|---|
| 143542 | 8/1980 | Fed. Rep. of Germany | 427/85 |
| 3032608 | 3/1981 | Fed. Rep. of Germany | 427/85 |
| 1424917 | 2/1976 | United Kingdom | 427/85 |

*Primary Examiner*—Sadie L. Childs
*Attorney, Agent, or Firm*—John A. Fisher

[57] ABSTRACT

A process is disclosed for doping a semiconductor substrate which achieves a lower sheet resistivity than is otherwise obtainable. A spin-on dopant material is applied to the surface of the semiconductor substrate and subsequently heated to drive off solvents contained in the dopant material. The layer of spin-on dopant material is then plasma treated, preferably in an oxygen plasma, to enhance the diffusion properties of the spin-on material. The substrate and dopant material are then heated to an elevated temperature to accomplish the desired depth of diffusion.

15 Claims, 8 Drawing Figures

PLASMA ENHANCED DIFFUSION PROCESS

BACKGROUND OF THE INVENTION

This invention relates generally to a process for doping a semiconductor substrate, and more specifically to a plasma enhanced diffusion process.

In the fabrication of semiconductor devices such as diodes, transistors, integrated circuits, and the like, conductivity determining impurities are introduced into localized regions of a semiconductor substrate to form PN junctions or high/low junctions. The conductivity determining dopant material can be introduced by a thermal predeposition, ion implantation, diffusion from a doped oxide, diffusion from a spin-on glass source, or the like. For many applications the various doping techniques are interchangeable, with the prime purpose of the doping technique being to introduce a prescribed amount of dopant into or onto the surface of the substrate. The dopant material can then be redistributed by thermal diffusion as required for the particular device. The combination of a predeposition of a prescribed amount of dopant and a thermal redistribution determines the junction depth and sheet resistivity of the final diffused region. Important criteria desired of any diffusion process include uniformity and reproduceability of the diffused junction, controllability of junction depth, controllability of sheet resistivity, and compatibility with a general manufacturing process. In some applications it is also important to reduce the total thermal ambient to which a device is exposed, that is, to reduce the time a device is exposed to elevated temperatures.

One process which meets most of the foregoing criteria and which is applicable in a variety of device fabrication processes is the application of a spin-on dopant material followed by thermal redistribution. Such a process is uniform and reproducible, can provide a wide range of junction depths and sheet resistivities, is highly manufacturable, and requires only a minimal amount of capital equipment. The spin-on process, however, is somewhat limited in ability to achieve shallow, low resistivity diffused regions. A need therefore existed for an improved spin-on diffusion process which could achieve more heavily doped diffused regions.

It is therefore an object of this invention to provide an improved spin-on diffusion method.

It is another object of this invention to provide an improved spin-on diffusion method capable of achieving low resistivity diffused regions.

It is yet another object of this invention to provide an improved spin-on diffusion process which involves less thermal ambient than other diffusion processes for the same diffusion results.

BRIEF SUMMARY OF THE INVENTION

The foregoing and other objects and advantages are achieved in the present invention through the use of a plasma enhanced spin-on diffusion process. A spin-on dopant material is applied to the surface of a substrate to be diffused and is heated to a first temperature to drive off solvents contained in the dopant material. The dopant material is then plasma treated, preferably in an oxygen plasma, to enhance the diffusion properties. The substrate with the dopant material thereon is then heated to an elevated temperature for the thermal redistribution of the dopant into the substrate.

DETAILED DESCRIPTION OF THE PREFERRED EMBODIMENTS

Figure 1:
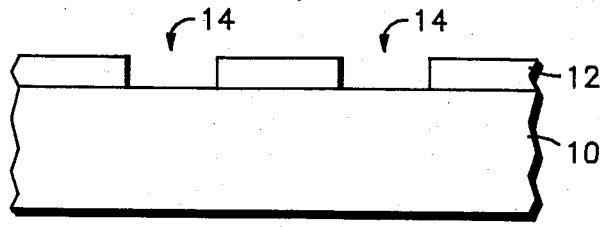
FIGS. 1-3 illustrate process steps in accordance with the invention.
Figure 2:
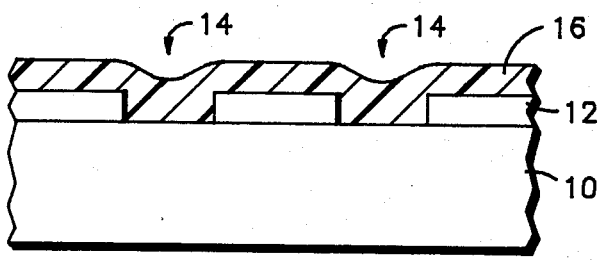
Figure 3:
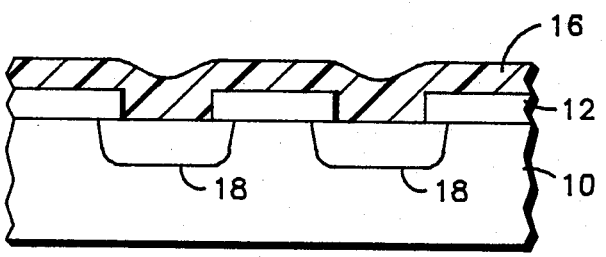

FIGS. 1-3 illustrate process steps in accordance with one embodiment of the invention. FIG. 1 illustrates a semiconductor substrate 10 into which doped zones are to be diffused. Substrate 10 can be, for example, a silicon substrate having a predetermined resistivity. Overlying the surface of substrate 10 is a patterned diffusion mask 12 of silicon dioxide, silicon nitride, or the like. Mask 12 is patterned to provide a plurality of apertures 14 through which the dopant material can be diffused. The exact pattern which is used will, of course, be dependent upon the device to be fabricated.

A layer of spin-on dopant glass 16 is applied over the patterned mask as illustrated in FIG. 2. This spin-on dopant material penetrates through apertures 14 in mask 12 and contacts the surface of substrate 10. The spin-on dopant material can be, for example, a formulation as described in U.S. Pat. No. 3,789,023 or one of the commercially available spin-on dopant sources. The spin-on dopant material is a liquid medium including a dopant source for arsenic, phosphorus, antimony, boron, or the like, a glass former, and a suitable solvent. The dopant material is spun on the substrate in a uniform layer having a thickness of about 400 Å–3,000 Å. The thickness of the dopant layer is a second order effect in defining the final sheet resistivity of the resultant doped region. The dopant material is applied by spinning the substrate on a vacuum chuck and dispensing a drop of the liquid dopant material onto the substrate surface. The substrate is spun at a speed of 2,000–6,000 rpm for about 10 seconds. To achieve optimum uniformity, the spin speed is ramped up from about 600 rpm to the desired speed of 2,000–6,000 rpm.

After application of the dopant layer to the patterned mask and substrate, the substrate and dopant layer are prebaked at a temperature of 150°–400° C. for about 30–60 minutes to drive off solvent from the dopant material. The prebaking can be done, for example, in air, nitrogen, or a mixture of nitrogen and oxygen. More uniform results are achieved using a controlled nitrogen or nitrogen plus oxygen ambient. Lower resultant sheet resistivities are achieved using nitrogen plus about 10% oxygen for the prebake ambient rather than pure nitrogen.

After the prebake, the dopant layer is exposed to a plasma environment to enhance the diffusion properties of the layer. The layer is exposed, for example, for a period of about 15–45 minutes to an oxygen containing plasma. The plasma treatment can be carried out in any of the conventional plasma reactors commonly used for etching, deposition, or ashing.

The substrate and spin-on dopant layer are heated to an elevated redistribution temperature to diffuse dopant impurities from the dopant layer 16 into the substrate 10 to form diffused regions 18. The diffusion is carried out at a temperature of about 850°–1200° C. for a sufficient time to achieve the desired junction depth in accordance with standard diffusion theory. The diffusion is preferably done in an ambient of nitrogen and oxygen, such as a mixture of 20% oxygen in nitrogen.

Figure 4:
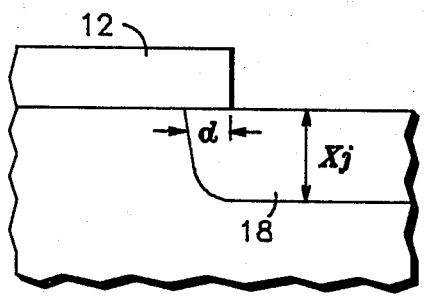
FIG. 4 illustrates geometric junction properties.

Diffusions performed in accordance with the invention, utilizing a plasma pretreatment step, are found to produce a diffused region having much lower sheet resistivity than diffusions performed identically except for the elimination of the plasma pretreatment step. In addition, it has been observed that the lateral diffusion of dopant impurity is less for a diffusion performed in accordance with the invention. FIG. 4 illustrates a cross-section through a diffused region 18. As dopant material diffuses into a substrate through an opening in a diffusion mask 12, the dopant material diffuses laterally as well as vertically. In a conventional diffusion, the lateral diffusion, d, is usually found to be on the order of 40% of the vertical diffusion depth $X_j$. In contrast, diffusions performed in accordance with the invention are found to have d approximate equal to 0.1 $X_j$. The combined results of low resistivity and reduced lateral diffusion make the diffusion technique, in accordance with the invention, particularly useful for devices requiring closely spaced, high conductivity diffused regions.

Figure 5:
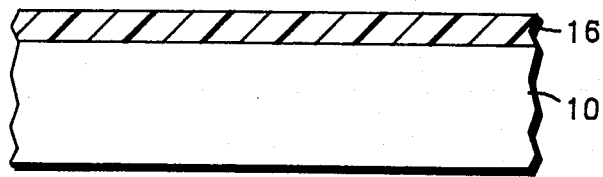
FIGS. 5-7 illustrate a process in accordance with another embodiment of the invention.
Figure 6:
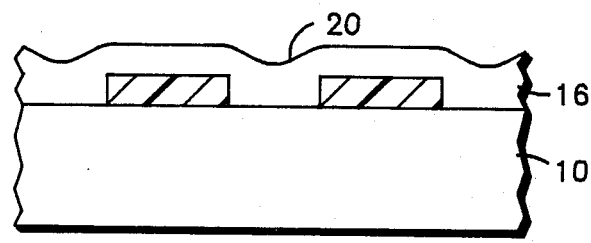
Figure 7:
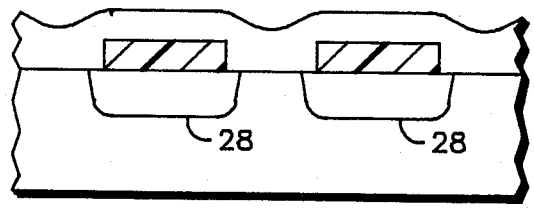

FIGS. 5-7 illustrate process steps in accordance with an alternate embodiment of the invention. In this embodiment a pattern of diffused regions is achieved by prepatterning the spin-on dopant layer so that a patterned diffusion mask is not required. As illustrated in FIG. 5, a layer 16 of spin-on dopant material is applied directly to the surface of a semiconductor substrate 10. Other areas of the substrate may, of course, be covered by oxides, nitrides, or the like, but in the area of interest no diffusion mask is required. As above, the dopant material is applied by dropping the liquid dopant material onto a substrate and then spinning the substrate at a prescribed rotational speed.

The spin-on doped layer is patterned photolithographically to leave the dopant material in those areas which are to receive a diffusion. The dopant material is prebaked, as above, either before or after the patterning. After patterning, the spin-on dopant material is exposed to a plasma pretreatment, as above. Optionally, a capping layer 20 of oxide, nitride, or the like can be deposited over the pattern of spin-on dopant regions. The capping layer prevents the out-diffusion of dopant from the dopant regions and prevents the unwanted diffusion of dopant material into exposed surface areas.

The substrate having patterned dopant material on the surface thereof is then heated to an elevated redistribution temperature to cause the diffusion of dopant material from the patterned regions into the semiconductor substrate. Diffused regions 28 are formed in the semiconductor substrate under the patterned regions of dopant material as illustrated in FIG. 7.

The following non-limiting examples further illustrate the practice of the invention and advantages achieved thereby.

EXAMPLE ONE

Figure 8:
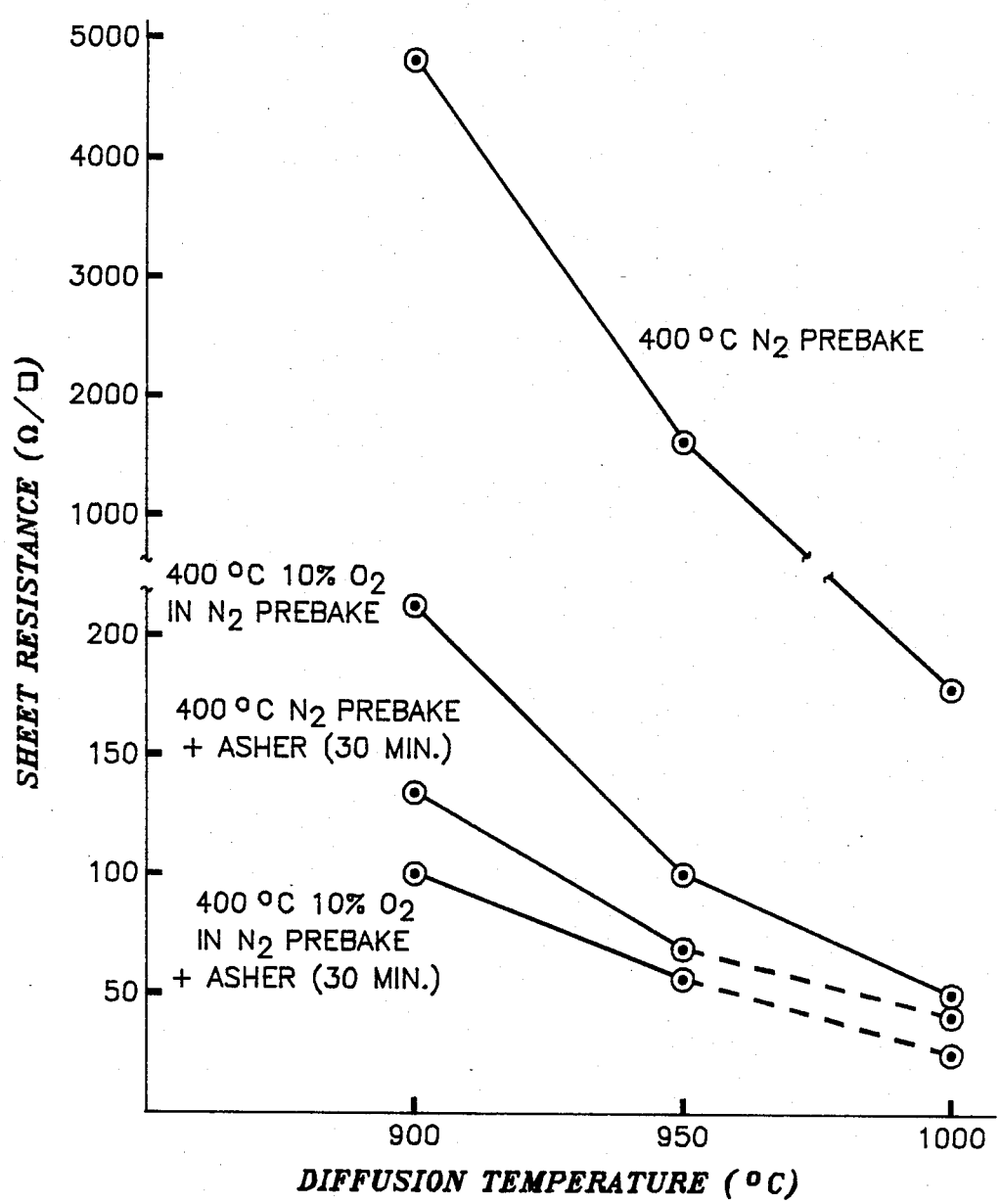
FIG. 8 graphically illustrates diffusion results in accordance with the invention.

A number of 5-10 ohm-cm P-type wafers having a (111) orientation were given a standard prediffusion clean. A spin-on dopant solution was prepared in accordance with the formulation of U.S. Pat. No. 3,789,023. This solution contained $As_2O_5$ as an arsenic diffusion source in an amount to provide about 25% by weight of arsenic in the glass. The diffusion source was applied to each of the wafers by spin application, with the wafers being spun at about 2000 rpm for about 10 seconds to form a spin-on dopant layer having a thickness of about 1500 Å. Each wafer was then prebaked for 60 minutes in either a nitrogen ambient or in a 10% oxygen in nitrogen ambient. The wafers were divided into two groups, with one group serving as a control. Each wafer of the other group was exposed to a plasma treatment in a Tegal 200 plasma reactor for 30 minutes. Pressure in the chamber was set at about 800 Pa. The plasma gas was pure oxygen, power was set at 300 watts, and the wafer temperature at the end of the plasma treatment was approximately 212° C. The control group received no plasma treatment. Following the plasma treatment, all wafers were heated to a diffusion temperature of 900° C., 950° C., or 1000° C. for 30 minutes in an ambient of 20% oxygen in nitrogen. The temperature was ramped from about 800° C. to the selected diffusion temperature, and after the prescribed time at the diffusion temperature the temperature was ramped back down to 800° C. The sheet resistivity of each wafer was measured. Results of the measurements are presented in graphical form in FIG. 8. The marked reduction in sheet resistivity from the plasma pretreatment is noted. The reduced sheet resistivity from prebaking in an oxygen/nitrogen ambient compared to a pure nitrogen ambient is also noted.

EXAMPLE TWO

Wafers were prepared as in EXAMPLE ONE except that the spin-on source was Accuspin As 120, a product of Allied Chemical. The spin-on dopant layer was about 850 Å in thickness. Wafers prepared with and without an oxygen plasma pretreatment were diffused for 30 minutes at 950° C. and the sheet resistivity of the wafers was measured. The sheet resistivity of wafers having an oxygen plasma pretreatment was measured to be about 75-80 ohms per square. The sheet resistivity of wafers which did not receive the oxygen plasma pretreatment was measured to be about 350-585 ohms per square.

Thus, it is apparent that there has been provided, in accordance with the invention, a plasma enhanced diffusion process which fully meets the objects and advantages set forth above. The invention has been described with reference to certain specific embodiments thereof but it is not intended that the invention be limited to those illustrative embodiments. Those skilled in the art, after review of the foregoing detailed description, will recognize that variations and modifications differing from the illustrative embodiment are possible which still fall within the spirit and scope of the invention. Other diffusion sources such as boron, antimony, or phosphorous, other diffusion times, temperatures and ambients, other source application procedures and plasma pretreatment conditions, for example, are illustrative of such variations and modifications. It is intended that all such variations and modifications be included within the invention.

I claim:

1. A process for doping a semiconductor substrate which comprises the steps of: applying spin-on dopant material to said substrate; heating said material to a first temperature; plasma treating said material to enhance the conductivity of diffused regions formed therefrom; and heating said substrate to a second temperature higher than said first temperature.

2. The process of claim 1 wherein said step of plasma treating comprises placing said material in an oxygen plasma.

3. The process of claim 2 wherein said step of plasma treating is continued for 15–45 minutes.

4. The process of claim 1 wherein said spin-on material is applied in a layer having a thickness of about 400–3000 Å.

5. The process of claim 1 wherein said dopant material comprises a conductivity determining impurity selected from the group consisting of phosphorous, arsenic, antimony, and boron.

6. The process of claim 1 wherein said first temperature is between about 150° C. and about 400° C.

7. The process of claim 1 wherein said second temperature is about 850° C. or greater.

8. The process of claim 1 wherein said step of heating said substrate and material to a second temperature comprises the steps of: heating to about 800° C.; ramping said temperature upward to said second temperature; and then ramping said temperature downward.

9. The process of claim 6 wherein said heating to a first temperature is done in air.

10. The process of claim 6 wherein said heating to a first temperature is done in an ambient comprising $N_2$.

11. The process of claim 10 wherein said heating to a first temperature is done in an ambient comprising $N_2$ and $O_2$.

12. The process of claim 1 further comprising the step of patterning said dopant material.

13. A process for doping a semiconductor substrate which comprises the steps of: providing a patterned masking layer on said substrate; applying a layer of spin-on dopant material overlying said masking layer and said substrate; heating said dopant material to a temperature of about 150° C.–400° C.; exposing said dopant material to an oxygen plasma; and heating said dopant material to a temperature of 850°–1200° C. to diffuse said dopant into said substrate.

14. The process of claim 13 further comprising the step of forming a capping layer overlying said layer of spin-on dopant material.

15. A process for doping a semiconductor substrate which comprises the steps of: forming a patterned diffusion mask on the surface of said substrate, said mask having apertures therein to expose selected portions of said substrate; forming a layer of spin-on dopant material overlying said mask and extending into said apertures to contact said selected portions of said substate; heating said layer to about 150°–400° C.; exposing said layer to a plasma comprising oxygen; and heating said layer to a temperature of about 850°–1200° C.

* * * * *